United States Patent
Peterson et al.

(10) Patent No.: US 6,788,063 B1
(45) Date of Patent: Sep. 7, 2004

(54) METHOD AND SYSTEM FOR IMPROVING TRANSIENT NOISE DETECTION

(75) Inventors: William Todd Peterson, Sussex, WI (US); Michael Edward Denzin, Lake Mills, WI (US); Randall Henry Buchwald, Waukesha, WI (US)

(73) Assignee: GE Medical Systems Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/248,877

(22) Filed: Feb. 26, 2003

(51) Int. Cl.[7] ............................................... G01V 3/00
(52) U.S. Cl. ...................................... 324/322; 324/318
(58) Field of Search ............................... 324/322, 318, 324/319, 309, 307; 370/480

(56) References Cited

U.S. PATENT DOCUMENTS

| | | | | |
|---|---|---|---|---|
| 5,245,288 A | * | 9/1993 | Leussler | 324/322 |
| 5,525,906 A | * | 6/1996 | Crawford et al. | 324/322 |
| 6,233,254 B1 | * | 5/2001 | Myers | 370/480 |
| 6,420,873 B1 | * | 7/2002 | Guthrie | 324/322 |

* cited by examiner

Primary Examiner—Brij B. Shrivastav
(74) Attorney, Agent, or Firm—Artz & Artz, PC

(57) ABSTRACT

A transient noise detection system includes an imaging system having a magnetic field coil and an imaging bore. The imaging system generates an imaging signal through a signal cable, wherein the imaging signal is corruptible by a noise event. A noise event detector is positioned outside of the imaging bore and proximate to the signal cable. This detector detects the noise event from the signal cable and generates a noise signal therefrom.

15 Claims, 2 Drawing Sheets

METHOD AND SYSTEM FOR IMPROVING TRANSIENT NOISE DETECTION

BACKGROUND OF INVENTION

The present invention relates generally to Magnetic Resonance Imaging (MRI) systems, and more particularly, to a method and system for improving transient noise detection.

Magnetic Resonance Imaging (MRI) is a well-known medical procedure for obtaining detailed, one, two and three-dimensional images of patients, using the methodology of nuclear magnetic resonance (NMR). MRI is well suited to the visualization of soft tissues and is primarily used for diagnosing disease pathologies and internal injuries.

Typical MR systems include a superconducting magnet capable of generating a strong, homogenous magnetic field around a patient or portion of the patient; a radio-frequency (RF) transmitter and receiver system, including transmitter and receiver coils, also surrounding or impinging upon a portion of the patient; a magnetic gradient coil system also surrounding a portion of the patient; and a computer processing/imaging system, receiving the signals from the receiver coil and processing the signals into interpretable data, such as visual images.

The superconducting magnet is used in conjunction with a magnetic gradient coil assembly, which is temporally pulsed to generate a sequence of controlled gradients in the main magnetic field during a MR system data gathering sequence.

MRI systems are sensitive to RF signals including the desired signal from the patient, as well as any undesired RF noise energy. A class of RF noise energy, commonly referred to as transient or "spike" noise, has origins as a triboelectric phenomena.

Triboelectricity results when two materials are in contact with one another and are subsequently separated. Vibration introduced into the system through gradient coil operation usually provides the mechanical movement necessary for intermittent contacts and triboelectric events. Charge transfer (or static electricity) imbalances build up and eventually result in an electric discharge. This discharge generally occurs very rapidly and with significant (though short duration) current flow, and a broadband RF radiation results. This RF noise energy, when coupled into the MR system input, tends to result in distorting image artifacts.

A Transient Noise Filter is typically provided to reduce the impact of the aforementioned artifact. Current Transient Noise Filters, however, have performance shortcomings, such as using MR signals to sense noise events.

For example, current MR systems attempt to sense transient noise events on the incoming receive signal line. At this point in system operation, the broadband RF noise energy has been substantially shaped by the system coil, receive filters, and preamplifier characteristics. Consequently, the remaining energy is not easily separable from the desired MR information using current technology.

Using an incoming MR signal to sense a noise event also requires that the MR signal be delayed for activation of remedial measures. This delay function limits the bandwidth of the MR signaling path and degrades the phase and frequency performance of the MR signal. Therefore, the effectiveness of current implementations is inherently limited.

The disadvantages associated with current MR systems have made it apparent that a new technique for transient noise detection is needed. The new technique should detect transient noise independent of the MR signal and should not be dependent on the field strength of the scanner or scanner mode. The present invention is directed to these ends.

SUMMARY OF THE INVENTION

In accordance with one aspect of the present invention, a transient noise detection system includes an imaging system including a magnetic field coil and an imaging bore. The imaging system is adapted to generate an imaging signal through a signal cable, wherein the imaging signal is corruptible by a noise event. A noise event detector is positioned outside of the imaging bore and proximate to the signal cable and is adapted to detect the noise event. The noise event detector is also adapted to generate a sensed noise signal.

In accordance with another aspect of the present invention, a method for transient noise detection for an MR system having a magnet bore includes generating an MR image signal wherein the MR image signal is corrupted by noise, detecting the noise within the MR image signal external to the magnet bore, generating a detected noise signal, and correcting the MR signal of the detected noise signal.

One advantage of the present invention is that detection of transient noise independent of the MR signal preserves full MR signal clarity. Furthermore, the present method is not dependent on scanner field strength or scanner mode.

The present invention, together with attendant advantages, will be best understood by reference to the following detailed description, taken in conjunction with the accompanying FIGURES.

BRIEF DESCRIPTION OF DRAWINGS

For a more complete understanding of this invention reference should now be had to the embodiments illustrated in greater detail in the accompanying FIGURES and described below by way of examples of the invention wherein.

DETAILED DESCRIPTION

While the present invention is described with respect to a method for improving transient noise detection in MR systems, the present invention may be adapted to transient noise detection within various systems including: cylindrical and various other magnetic field geometries as well as various RF coils.

In the following description, various operating parameters and components are described for one constructed embodiment. These specific parameters and components are included as examples and are not meant to be limiting.

Figure 1:
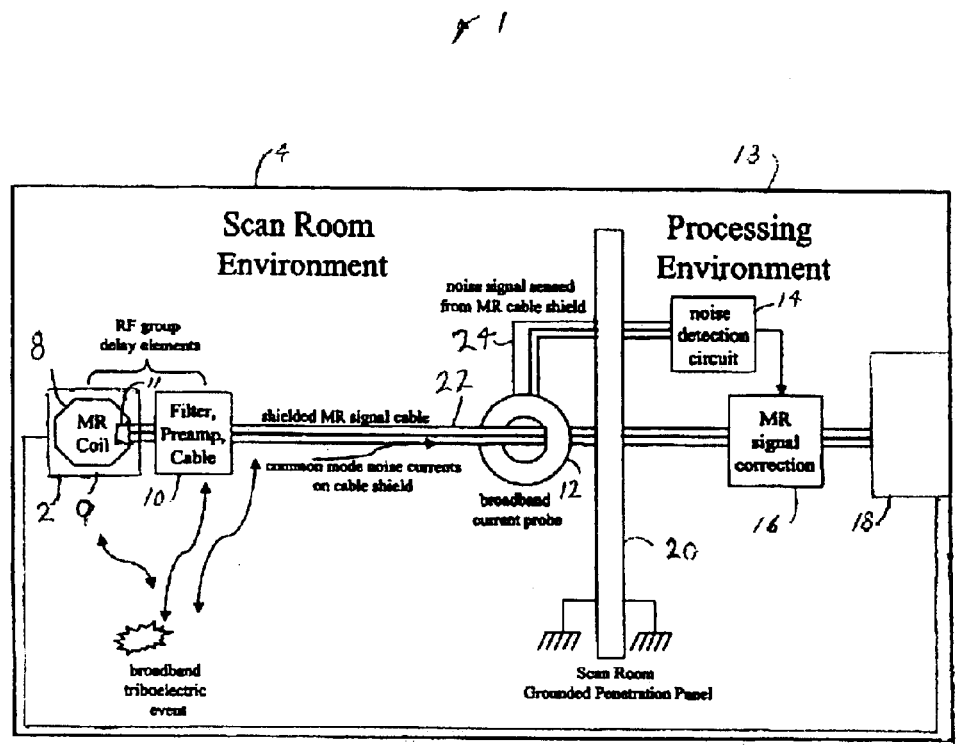
FIG. 1 is a block diagrammatic view of a transient noise detection system in accordance with one embodiment of the present invention.

Referring to FIG. 1, a noise detection and correction system 1 for a magnetic resonance imaging system 2 (MR system) or radio-frequency system (RF), in accordance with one embodiment of the present invention, is illustrated.

The system 1 includes a scan room environment 4, including an MR coil assembly 8 within a magnet structure 9, filter cable 10, a shielded MR signal cable 22, a noise signal cable 24, and a broadband current probe 12. The system 1 further includes a processing environment 13 including a noise detection circuit 14, MR correction controller 16 and MR imaging controller 18. A scan room grounded penetration panel 20 is disposed between the two rooms, substantially shielding the scan room 4 from the processing environment 13.

The embodied MR magnet structure 9 and coil assembly 8, are typical of those found in the medical field. The magnet structure 9 includes a scanning bore 11, wherein an object or patient is positioned for imaging. The coil assembly 8, which is typically mounted around the scanning bore 11, includes a superconducting magnet having a plurality of superconducting magnetic field coils. The superconducting magnetic field coils generate a temporally constant magnetic field along a longitudinal z-axis of the scanning bore 11. The MR signal results from this magnetic field. The MR signal is filtered and amplified in the filter and preamp cable 10 and transmits through a shielded MR cable 22.

The MR coil assembly 8 and the filter and preamp cable 10 are RF group delay elements, as will be understood by one skilled in the art.

A triboelectric discharge is a broadband RF noise signal source, which results when two materials are in contact with one another and are subsequently separated. A source of this type injects charge currents into the conductive mechanical structures, such as the MR coil assembly 8 and the filter and preamp cable 10. This resultantly generates noise potential differences in these structures. The noise voltage drives common-mode radiation from the immediate structures, which is then electrically coupled to essentially all the conductive surfaces of the system 1. This coupling drives common mode noise currents into the cable shields of the system interconnect cables (shielded MR signal cable 22) within the scan room environment 4.

The present invention includes a noise event detector, such as a common mode current sense loop (broadband current probe 12) for detecting the aforementioned noise currents. The loop is positioned with in a proximity of the shielded MR cable 22 or the filter preamp cable 10. Alternately, the cables 10, 22 are surrounded by the loop, a noise voltage is induced into the loop. The signal from this sense loop is not limited in bandwidth or indistinguishable with the MR signal. The dynamic range of sense loop signal simplifies characterization of the transient noise energy. Resultantly, noise events are distinguished from other RF signals.

The sense loop signal pathway does not encounter the group delay elements of the MR signal path. A noise signal cable 24 directs the common mode noise current signal sensed on the shielded MR signal cable 22. This allows the noise signal to be sensed hundreds of nanoseconds before the corrupted MR signal. This early detection interval facilitates effective remediation.

Both the shielded MR cable 22 and the noise signal cable 24 are received within the processing environment 13 either around or through the scan room grounded penetration panel 20.

The noise detection circuit 14 receives the noise signal, and generates a detected noise signal. The detected noise signal is received, along with the shielded MR signal, within the MR signal correction controller 16. The MR signal correction controller 16 generates a corrected MR signal. The corrected MR signal is received in the imaging controller 18, where it is converted to signal data. The conversion process is well known in the art. The signal data is then in a format for display on a video monitor for analysis and data collection.

The concept of detecting the broadband RF emissions from transient (triboelectric) noise events is not limited to the use of an H-field transducer (broadband current probe 12) at the location of the penetration panel 20. Other implementations include H-field transducers such as a loop antenna within the environment of the magnetic structure 9 to yield a useful representation of the broadband transient RF emissions. The emissions from the transient events are also detected using an E-field transducer, typically a monopole, dipole or multi-element array. A directly connected current or voltage probe to some existing conductor (incidentally functioning as an RE transducer/probe) provides yet another system for detecting the transient signal.

One of the key novel components of this invention is the use of a common mode sense loop to observe the noise signal at a location outside of the bore of the magnet. It is not obvious that a better representation of the noise signal is generated independent of the critical MR signal. The embodied approach includes separate transient input conductors from those carrying the MR information.

Figure 2:
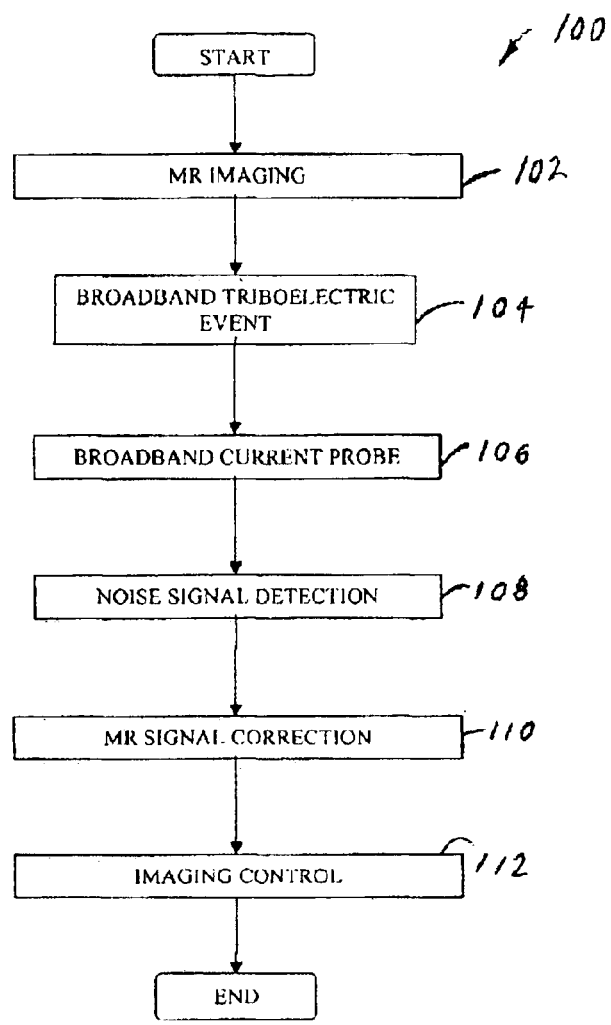
FIG. 2 is a logic flow diagram of a method for improving transient noise detection.

Referring to FIG. 2, a logic flow diagram 100 of a method for improving transient noise detection, in accordance with another embodiment of the present invention, is illustrated.

Logic starts in operation block 102 where the MRI system commences imaging and generates an imaging signal, which is filtered and amplified, as will be understood by one skilled in the art.

In operation block 104, the MRI system and shielded cables is affected by, for example, a broadband triboelectric event.

In operation block 106, the broadband current probe detects the noise signal from the MR cable shield. The broadband current probe is positioned within a close proximity to or surrounding the MR signal cable, such that noise is readily detectable.

In operation block 108, the noise detection circuit receives signals from the broadband current probe and converts them to a form useable by the MR signal correction controller.

In operation block 110, the MR signal correction controller in the processing room receives both the noise signal and the original MR signal from the scan room and eliminates distortion in the MR signal caused by the noise signal.

In operation block 112, the imaging controller receives the corrected MR signal and reconstructs an image therefrom.

In operation, a method for transient noise detection for an MR system having a magnet bore includes generating an MR image signal wherein the MR image signal is corrupted by noise. The noise within the MR image signal is detected external to the magnet bore. A detected noise signal is generated and the MR signal is corrected with regard to the detected noise signal.

The above-described steps are meant to be an illustrative example; the steps may be performed synchronously or in a different order depending upon the application.

The above-described apparatus, to one skilled in the art, is capable of being adapted for various purposes and is not limited to the following systems: MR systems, magnetic resonance spectroscopy systems, and other applications where field instability is an issue in the design of system components. The above-described invention may also be varied without deviating from the spirit and scope of the invention as contemplated by the following claims.

What is claimed is:

1. A transient noise detection system for an MR system comprising: a magnetic field coil and an imaging bore, the MR system adapted to generate an imaging signal through a signal cable, wherein said imaging signal is corruptible by a noise event; and a noise event detector positioned outside of said imaging bore and proximate to said signal cable and adapted to detect said noise event from said signal cable, said noise event detector adapted to generate a noise signal therefrom; a noise detection circuit adapted to receive said noise signal and generate an MR useable noise signal therefrom; an MR signal correction controller adapted to receive said MR useable noise signal and said imaging signal and generate a corrected imaging signal therefrom, and an imaging controller adapted to receive said corrected imaging signal, said imaging controller adapted to control the MR system.

2. A transient noise detection system for an MR system as in claim 1 further comprising a filter and preamp cable adapted to receive said imaging signal and generate therefrom a filtered and amplified imaging signal, wherein said noise event detector is adapted to detect a noise event within said filtered and amplified imaging signal and generate therefrom said noise signal.

3. A transient noise detection system for an MR system as in claim 1 further comprising a scan room grounded penetration panel positioned between and substantially insulating the MR system and said noise detection circuit, said MR signal correction, and said imaging controller.

4. A transient noise detection system for an MR system as in claim 3 wherein said noise event detector is positioned in close proximity to said signal cable and said scan room grounded penetration panel.

5. A transient noise detection system for an MR system as in claim 1 wherein said noise event detector surrounds said signal cable.

6. A transient noise detection system for an MR system as in claim 1 wherein said noise event detector is at least one of a broadband current probe, a broad band voltage probe, an E-field transducer, an H-field transducer or a voltage probe or current probe coupled to a conductor acting as a transducer or a loop antenna within the MR system.

7. A method for transient noise detection for an MR system having a magnet bore comprising; generating an MR image signal wherein said MR image signal is corrupted by noise; detecting said noise within said MR image signal external to the magnet bore; generating a detected noise signal; correcting said MR signal of said detected noise signal; and surrounding a cable, which conducts said image signal, with a broadband probe wherein said probe generates said detected noise signal.

8. A transient noise detection system for an imaging system comprising: a magnetic field coil and an imaging bore, the imaging system adapted to generate an imaging signal through a signal cable, wherein said imaging signal is corruptible by a noise event; a noise event detector positioned outside of said imaging bore and proximate to said signal cable and adapted to detect said noise event from said signal cable, said noise event detector adapted to generate a sensed noise signal therefrom, said noise event detector comprising at least one of a broadband current sense loop, a broadband voltage sense loop, an E-field transducer, an H-field transducer or a voltage probe or current probe coupled to a conductor acting as a transducer or a loop antenna within the imaging system.

9. A transient noise detection system as in claim 8 further comprising a noise detection circuit adapted to receive said noise signal and generate a detected noise signal.

10. A transient noise detection system as in claim 9 further comprising an imaging signal correction controller adapted to receive said detected noise signal and said imaging signal and generate a corrected imaging signal therefrom.

11. A transient noise detection system as in claim 10 further comprising an imaging controller adapted to receive said corrected imaging signal.

12. A transient noise detection system as in claim 8 further comprising a filter and preamp cable adapted to receive said imaging signal and generate therefrom a filtered and amplified imaging signal, wherein said noise event detector is adapted to detect said noise event within said filtered and amplified imaging signal and generate therefrom said noise signal.

13. A transient noise detection system as in claim 8 further comprising a scan room grounded penetration panel positioned between and substantially insulating the imaging system and said noise detection circuit, an MR signal correction, and an imaging controller.

14. A transient noise detection system in claim 13 wherein said noise event detector is positioned in close proximity to said signal cable and said scan room grounded penetration panel.

15. A transient noise detection system as in claim 8 wherein said noise event detector surrounds said signal cable.

* * * * *